BLOCKING OSCILLATOR WITH ADDITIONAL REGENERATIVE FEEDBACK

Filed Dec. 28, 1960

INVENTORS
WILLIAM GELLER
MARTIN FISCHMAN
BY
R. J. Frank
ATTORNEY

United States Patent Office 3,156,876
Patented Nov. 10, 1964

3,156,876

BLOCKING OSCILLATOR WITH ADDITIONAL REGENERATIVE FEEDBACK

Martin Fischman, Wantagh, and William Geller, Plainview, N.Y., assignors to General Telephone and Electronics Laboratories, Inc., a corporation of Delaware Filed Dec. 28, 1960, Ser. No. 78,970
3 Claims. (Cl. 331—112)

This invention relates to pulse oscillators and, in particular, to a frequency stable pulse oscillator.

Oscillators designed to generate pulses having steep leading and trailing edges find wide applications in television and other electronic apparatus. These known pulse oscillators are generally of the relaxation type in which the frequency is determined by resistance-capacitance or resistance-inductance networks. However, it has been found that relatively wide frequency variations occur in relaxation oscillators with changes in supply voltage, transistor characteristics due to environmental conditions, or loading and that these variations make them unsatisfactory for many purposes requiring high frequency stability. Accordingly, it is an object of our invention to provide an improved pulse oscillator having good frequency stability.

Another object of the invention is to provide an oscillator which generates output pulses having extremely steep leading and trailing edges.

Still another object is to provide an oscillator in which output pulses having both steep edges and a precisely maintained frequency are generated.

Yet another object is to provide a transistorized frequency stable pulse oscillator in which the power dissipated in the transistor is very low.

A further object is to provide a frequency stable pulse generator which utilizes a single transistor, requires a minimum number of components, and is relatively inexpensive to construct.

The pulse oscillator of the present invention comprises a transistor having first, second, and third electrodes corresponding to the emitter, base, and collector electrodes and first and second positive feedback means. A sinusoidal voltage which determines the pulse repetition frequency of the oscillator is produced across the first positive feedback means while the second positive feedback means provides an additional regenerative feedback voltage. The latter feedback voltage and the sinusoidal voltage are coupled in series between the first and second electrodes of the transistor.

In one embodiment of the invention, the first feedback means includes a resonant circuit while the second feedback means comprises a transformer having its primary winding connected to the collector of the transistor and a secondary winding coupled in series with the resonant circuit. The resonant circuit and secondary winding of the transformer are connected between the emitter and base electrodes of the transistor. The voltage across the secondary winding of the transformer is of opposite polarity to the voltage across the primary winding and, therefore, the voltage coupled into the base-emitter circuit provides regenerative or positive feedback.

More specifically, the first feedback means comprises an inductor having its ends coupled to the base and collector electrodes of the transistor respectively and a connection intermediate the two ends which is coupled to the emitter electrode. A capacitor is connected across the ends of the inductor. The second feedback means comprises a transformer having one winding coupled between the collector and emitter electrodes of the transistor and a second winding coupled between the base and emitter electrodes of the transistor. As shall be explained hereinafter, the first and second feedback means function together to produce an oscillator having good frequency stability and output pulses and having steep leading and trailing edges.

When the circuit is oscillating a sinusoidal voltage is produced across the resonant circuit which tends to drive the transistor in and out of conduction. The change in the current through the collector electrode of the transistor produces a pulsating voltage which appears at the secondary of the transformer and is added in series with the sinusoidal voltage. Thus, when the transistor starts to conduct, the current through the transistor increases, a voltage is produced at the secondary of the transformer with the proper polarity to cause regeneration, and the transistor turns on rapidly. Conversely, when the sinusoidal voltage starts to drive the transistor out of conduction, the transformer positive feedback voltage causes the transistor to cut off rapidly. If the transformer winding were omitted from the base-emitter circuit of the transistor, the transition of the transistor from a high to a low impedance state (and from a low to a high impedance state) would be quite slow and the output pulse would have relatively slow rise and fall times.

The above objects of and the brief introduction to the present invention will be more fully understood and further objects and advantages will become apparent from a study of the following description in connection with the drawings, wherein:

FIG. 1 is a schematic diagram of one form of oscillator illustrating our invention;

FIGS. 2, 3, and 4 are graphs showing the voltage waveform at the base, collector and emitter electrodes respectively of the transistor illustrated in FIG. 1;

Figure 1:
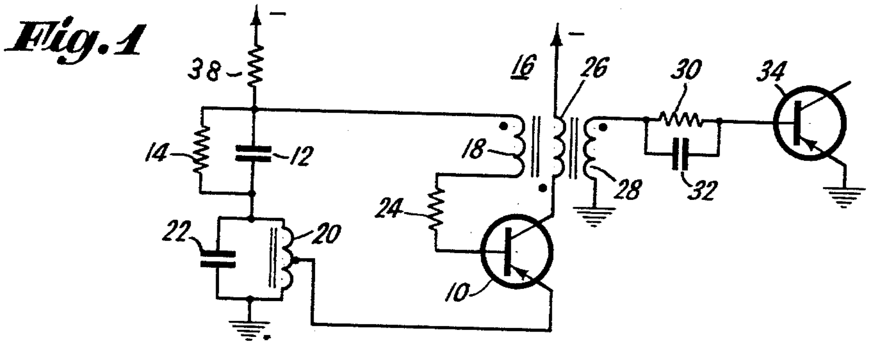

Referring to FIG. 1, there is shown a type PNP transistor 10 having emitter, base and collector electrodes. The emitter electrode is connected to the center tap of an inductor 20 which, together with capacitor 22, forms a resonant circuit. One end of the resonant circuit is connected to ground while the other end is coupled to the base electrode of the transistor through a biasing network consisting of capacitor 12 and resistor 14, the secondary winding 18 of transformer 16 and a damping resistor 24. The primary winding 26 of transformer 16, which is provided with a magnetic core, is connected between the collector of transistor 10 and a source of negative voltage while the output winding 28 of transformer 16 is connected through a network consisting of resistor 30 and capacitor 32 to the base of a transistor 34. Transistor 34 comprises any desired load and may, for example, be the input circuit of a horizontal output deflection amplifier for use in a transistorized television receiver.

A biasing network consisting of capacitor 12 and resistor 14 maintains the required bias voltage between the base and emitter electrodes of transistor 10. The components in the biasing network are so selected that capacitor 12 discharges during the period between pulses.

Figure 2:
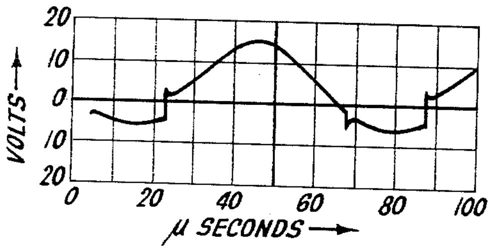
Figure 5:
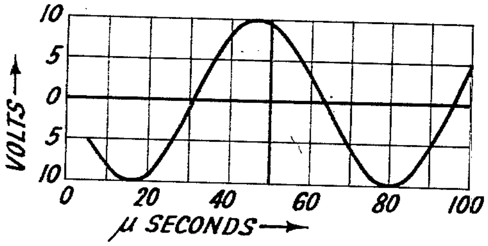
FIG. 5 is a graph showing the voltage waveform across the resonant circuit of FIG. 1.
Figure 6:
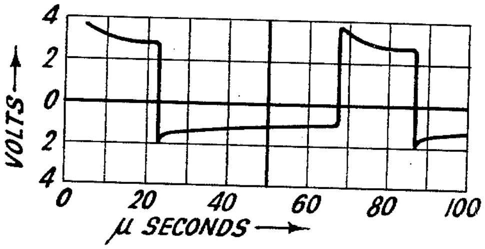
FIG. 6 is a voltage across the output winding of the transformer shown in FIG. 1.
Figure 4:
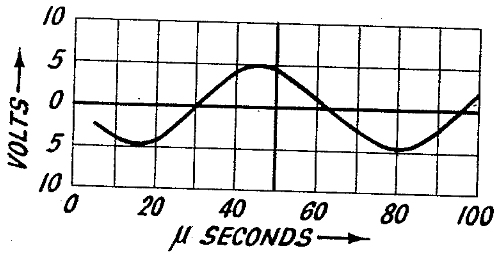

When power is applied to the circuit, current initially flows from the negative voltage source through auxiliary biasing resistor 38 into the base-emitter circuit of transistor 10. This initial current flow provides the necessary bias conditions for oscillations to begin. With the circuit oscillating, a sinusoidal voltage exists across the resonant circuit consisting of tapped inductor 20 and capacitor 22. When the sinusoidal voltage (FIG. 5) goes positive the base of transistor 10 tends to become positive with respect to the emitter voltage (FIG. 4) and the transistor is cut off. When the voltage on the base electrode of the transistor 10 is negative with respect to the emitter, the transistor tends to be driven into conduction. The change in current through the collector electrode of the transistor during this change of state causes a voltage pulse to appear across the secondary winding 18 of transformer 26 with such polarity as to increase the rate of the change. Thus, referring to FIG. 2, it is seen that about 24 microseconds after an arbitrarily assigned zero time the base voltage changes rapidly cutting off the transistor and, at about 66 microseconds, the base voltage again changes sharply driving transistor 10 into conduction. This results in the output pulse seen in FIG. 6 which exhibits extremely fast rise and fall times.

It has been found that, if the resistance in the base-emitter path of transistor 10 is very low, the leakage inductance across winding 18 of transformer 16 in combination with capacitor 12 may produce oscillation which tends to effect the width of the output pulse. Accordingly, damping resistor 24 is used to prevent such oscillation.

Typical component values which may be used in the circuit of FIG. 1 are as follows:

| | |
|---|---|
| Transistor 10 | Type 2N581. |
| Capacitor 12 | 0.1 microfarad. |
| Resistor 14 | 680 ohms. |
| Transformer 16 | Primary:secondary:output winding ratios, 3:1:1. |
| Inductor 20 | Tuned with capacitor 22 to 15.75 kilocycles. |
| Resistor 24 | 6.8 ohms |
| Capacitor 22 | 0.25 microfarad. |
| Resistor 38 | 1500 ohms. |
| Supply voltage | —12 volts. |

Figure 3:
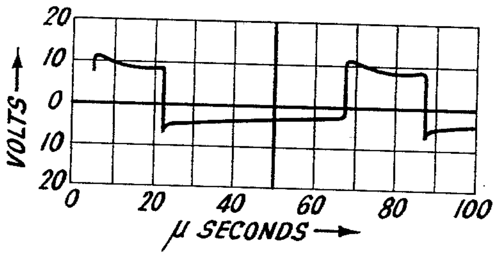
Figure 7:
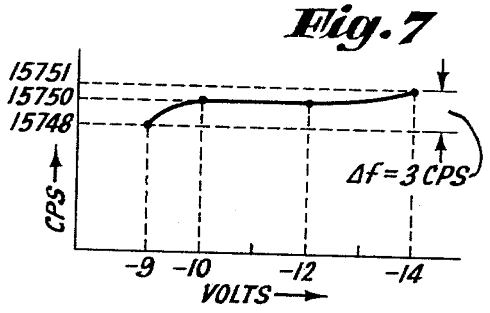
FIG. 7 is a graph showing the relationship between pulse repetition frequency and supply voltage for the circuit of FIG. 1.

With these values, 20 microsecond voltage pulses at the collector electrode (FIG. 3) and across the output and secondary windings (FIG. 6) are obtained having rise and fall times of approximately 0.1 microsecond. This output voltage waveform is suitable for driving television horizontal output deflection amplifiers as well as other types of electronic circuits. Further, as shown in FIG. 7, the frequency stability of the circuit is excellent; a change in supply voltage of —9 to —14 volts resulting in an overall change in frequency of about 3 cycles per second from the normal value of 15.75 kilocycles. In addition, with a voltage change of between —10 and —12 volts, there is substantially no deviation from the normal value.

Thus, a pulse oscillator having excellent frequency stability has been provided in which resonant circuit elements are employed to determine the pulse repetition frequency. The frequency stability of this circuit is considerably better than that obtained with conventional ringing coil stabilized relaxation oscillators in which resistance-capacitance elements are of importance in determining the operating frequency.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. A frequency stable pulse oscillator comprising (*a*) a transistor having first, second, and third electrodes;

(*b*) a resonant circuit including a tapped inductor and a capacitor, the tap on said inductor being coupled to said first electrode;

(*c*) a feedback transformer having a magnetic core and primary, secondary, and output windings, said primary winding being coupled between said third electrode and one end of said resonant circuit, the voltages produced across said primary and secondary windings being of opposite polarity;

(*d*) means coupling one end of said secondary winding to the second electrode of said transistor;

(*e*) a biasing network including a resistor and a biasing capacitor connected in parallel with said resistor, said capacitor discharging in the interval between pulses;

(*f*) means coupling said biasing network between said secondary winding and the other end of said resonant circuit; and (*g*) unidirectional current means coupled across said output winding, said unidirectional current means maintaining a low impedance across said transformer windings when said transistor is non-conducting.

2. A frequency stable pulse oscillator comprising (*a*) a transistor having emitter, base, and collector electrodes;

(*b*) a resonant circuit including a tapped inductor having first and second ends and a capacitor connected across the first and second ends of said tapped inductor;

(*c*) means coupling the tap on said inductor to said emitter;

(*d*) a feedback transformer having a magnetic core and primary, secondary, and output windings, said primary winding being connected between said collector electrode and the first terminal of a voltage source, having first and second terminals, the voltages produced across said primary and secondary windings being of opposite polarity;

(*e*) means coupling one end of said secondary winding to the base of said transistor;

(*f*) a biasing network including a resistor and a biasing capacitor connected in parallel with said resistor, said capacitor discharging in the interval between pulses;

(*g*) means coupling said biasing network between said secondary winding and the first end of said resonant circuit;

(*h*) an auxiliary biasing resistor having one end connected to the junction of said biasing network and said secondary winding and the other end connected to the first terminal of said voltage source;

(*i*) means coupling the second terminal of said voltage source to the second end of said tapped inductor; and (*j*) unidirectional current means coupled across said output winding, said unidirectional current means maintaining a low impedance across said transformer windings when said transistor is non-conducting.

3. A pulse oscillator as defined in claim 2 wherein a damping resistor is coupled in series with said secondary winding and wherein said unidirectional current means comprises the base-emitter circuit of a transistor.

References Cited in the file of this patent

UNITED STATES PATENTS

| | | |
|---|---|---|
| 2,055,375 | Cohen | Sept. 22, 1936 |
| 2,537,696 | Palmer | Jan. 9, 1951 |
| 2,767,359 | Larsen et al. | Oct. 16, 1956 |
| 2,781,449 | Mohr | Feb. 12, 1957 |
| 2,801,341 | Jaffe et al. | July 30, 1957 |
| 2,922,037 | Reise | Jan. 19, 1960 |
| 2,983,878 | Priebe | May 9, 1961 |
| 3,013,219 | Fischman | Dec. 12, 1961 |